(12) United States Patent
Yang et al.

(10) Patent No.: US 10,434,707 B2
(45) Date of Patent: Oct. 8, 2019

(54) TOUCH SUBSTRATE MANUFACTURED BY THREE-DIMENSIONAL PRINTING AND METHOD FOR MANUFACTURING THE SAME

(71) Applicant: TPK Universal Solutions Limited, Hong Kong (CN)

(72) Inventors: Shun-Jie Yang, Xinbei (TW); Shun-Ta Chien, Taoyuan (TW); Shih-Ching Chen, Zhongli (TW); Wen-Fu Huang, Zhongli (TW)

(73) Assignee: TPK Universal Solutions Limited, Hong Kong (CN)

( * ) Notice: Subject to any disclaimer, the term of this patent is extended or adjusted under 35 U.S.C. 154(b) by 221 days.

(21) Appl. No.: 15/442,930

(22) Filed: Feb. 27, 2017

(65) Prior Publication Data

US 2017/0246799 A1    Aug. 31, 2017

(30) Foreign Application Priority Data

Feb. 26, 2016    (CN) .......................... 2016 1 0109998

(51) Int. Cl.
*B29C 64/135*    (2017.01)
*H01L 21/02*    (2006.01)
(Continued)

(52) U.S. Cl.
CPC ............ *B29C 64/135* (2017.08); *B33Y 10/00* (2014.12); *B33Y 50/02* (2014.12); *B33Y 80/00* (2014.12);
(Continued)

(58) Field of Classification Search
CPC ......... B33Y 80/00; B33Y 10/00; B33Y 50/02; H05K 3/1241; G06F 2203/04103; G06F 3/045; G06F 3/044; B29C 64/112
See application file for complete search history.

(56) References Cited

U.S. PATENT DOCUMENTS

2015/0234486 A1* 8/2015 Huang ................. H05K 3/4685
430/319

FOREIGN PATENT DOCUMENTS

CN    104407459    3/2015
CN    104409170    3/2015
(Continued)

*Primary Examiner* — Selim U Ahmed
*Assistant Examiner* — Evan G Clinton
(74) *Attorney, Agent, or Firm* — Cooper Legal Group, LLC

(57) ABSTRACT

A touch substrate manufactured by three-dimensional printing and a method for manufacturing the same are disclosed. The method for manufacturing the touch substrate works together with a three-dimensional printer. The three-dimensional printer includes a first nozzle, a second nozzle, and a light source. The method includes the steps of: jetting a photocuring material by the first nozzle and exposing the photocuring material to the light source to form a base layer; jetting a conductive material on the base layer by the second nozzle and exposing the conductive material to the light source to form a touch electrode layer; and jetting the photocuring material on the base layer and the touch electrode layer by the first nozzle and exposing the photocuring material to the light source to form a protective layer. The touch electrode layer is embedded between the base layer and the protective layer.

8 Claims, 6 Drawing Sheets

(51) Int. Cl.
| | |
|---|---|
| *B33Y 10/00* | (2015.01) |
| *B33Y 50/02* | (2015.01) |
| *B33Y 80/00* | (2015.01) |
| *G05B 19/4099* | (2006.01) |
| *G06F 3/045* | (2006.01) |
| *H05K 1/16* | (2006.01) |
| *H05K 3/46* | (2006.01) |
| *G06F 3/044* | (2006.01) |
| *H05K 3/12* | (2006.01) |
| *B29K 25/00* | (2006.01) |
| *H05K 3/28* | (2006.01) |
| *B29C 64/112* | (2017.01) |

(52) U.S. Cl.
CPC ......... *G05B 19/4099* (2013.01); *G06F 3/044* (2013.01); *G06F 3/045* (2013.01); *H01L 21/02288* (2013.01); *H05K 1/162* (2013.01); *H05K 3/1241* (2013.01); *H05K 3/46* (2013.01); *B29C 64/112* (2017.08); *B29K 2025/00* (2013.01); *G06F 2203/04103* (2013.01); *H05K 3/28* (2013.01); *H05K 3/4685* (2013.01); *H05K 2203/0126* (2013.01)

(56) References Cited

FOREIGN PATENT DOCUMENTS

| | | |
|---|---|---|
| CN | 104409172 | 3/2015 |
| EP | 1887628 | 2/2008 |
| TW | 201243665 | 11/2012 |
| TW | 201438192 | 10/2014 |
| TW | 201446844 | 12/2014 |
| TW | M508717 | 9/2015 |
| TW | 201602258 | 1/2016 |
| TW | M526718 | 8/2016 |

\* cited by examiner

TOUCH SUBSTRATE MANUFACTURED BY THREE-DIMENSIONAL PRINTING AND METHOD FOR MANUFACTURING THE SAME

CROSS REFERENCE TO RELATED APPLICATIONS

This Non-provisional application claims priority under 35 U.S.C. § 119(a) to Patent Application No. 201610109998.8 filed in People's Republic of China on Feb. 26, 2016, the entire contents of which are hereby incorporated by reference.

BACKGROUND

Technical Field

The disclosure relates to a touch substrate and a method for manufacturing the same and, in particular, to a touch substrate manufactured by three-dimensional (3D) printing and a method for manufacturing the same.

Related Art

With the advance of technology, various digital devices are continuously invented, such as mobile phones, tablet computers, ultrabooks, GPS navigation devices, and on the like. In addition to general input or manipulation with a keyboard or a mouse, utilizing touch technology to manipulate the digital devices is a quite intuitive and popular manipulation method. Touch devices have a human and intuitive interface for input operation, so that users of any age can directly select or manipulate the digital devices with a finger or a stylus.

A conventional One-Glass-Solution (OGS) technology is to directly dispose a touch sensor on a substrate (e.g. a cover plate) to form a touch device. It is conventional to form the touch sensor on the substrate by a semiconductor manufacturing process. However, concerning manufacturing the touch sensor by the semiconductor manufacturing process, the process is quite complex and many kinds of materials need to be prepared, so that the overall difficulty in manufacturing the touch device is quite high and the cost is also difficult to reduce.

SUMMARY OF THE INVENTION

The disclosure is to provide a touch substrate manufactured by three-dimensional printing and a method for manufacturing the touch substrate. Compared with the conventional technology of manufacturing the touch substrate by the semiconductor manufacturing process, the touch substrate and the manufacturing method thereof according to the disclosure have the advantages of simple manufacturing process, higher precision, and relatively simple preparation of material.

A method for manufacturing a touch substrate by working together with a three-dimensional printer is provided. The three-dimensional printer includes a first nozzle, a second nozzle, and a light source. The method includes the steps of: jetting a photocuring material by the first nozzle and exposing the photocuring material to the light source to form a base layer; jetting a conductive material on the base layer by the second nozzle and exposing the conductive material to the light source to form a touch electrode layer; and jetting the photocuring material on the base layer and the touch electrode layer by the first nozzle and exposing the photocuring material to the light source to form a protective layer. The touch electrode layer is embedded between the base layer and the protective layer.

In at least one embodiment, the method further includes the step of: jetting the photocuring material between a plurality of touch electrodes on the touch electrode layer by the first nozzle and exposing the photocuring material to the light source.

In at least one embodiment, in the step of jetting the conductive material, the touch electrode layer includes a plurality of touch electrodes, and the touch electrodes respectively extend along a first direction and are arranged side by side along a second direction.

In at least one embodiment, the method further includes the step of: jetting the conductive material respectively on edges of the touch electrodes by the second nozzle and exposing the conductive material to the light source to form a plurality of bonding pads. Each of the bonding pads extends along a third direction, and the third direction is substantially perpendicular to the first direction and the second direction respectively.

In at least one embodiment, in the step of jetting the conductive material, the touch electrode layer includes a plurality of first touch electrodes and a plurality of second touch electrodes, the first touch electrodes respectively extend along a first direction and are arranged side by side along a second direction, and the second touch electrodes respectively extend along the second direction and are arranged side by side along the first direction.

In at least one embodiment, the method further includes the step of: jetting the conductive material respectively on edges of the first touch electrodes and edges of the second touch electrodes by the second nozzle and exposing the conductive material to the light source to form a plurality of first bonding pads and a plurality of second bonding pads. Each of the first bonding pads and each of the second bonding pads respectively extend along a third direction, and the third direction is substantially perpendicular to the first direction and the second direction respectively.

In at least one embodiment, the photocuring material includes a photoinitiator, an oligomer, a prepolymer, a reactive diluent, and an additive ultraviolet curing material.

In at least one embodiment, the conductive material includes the photocuring material and a plurality of conductive particles, and the conductive particles are nickel, gold, tin, silver, an alloy thereof, or a combination thereof.

A touch substrate manufactured by a three-dimensional printer is also disclosed. The touch substrate includes a base layer, a touch electrode layer, and a protective layer. The touch electrode layer is disposed on the base layer. The protective layer is disposed on the base layer and the touch electrode layer. The material of the protective layer is identical to that of the base layer, and the touch electrode layer is embedded between the base layer and the protective layer.

In at least one embodiment, the base layer is formed by jetting a photocuring material by a first nozzle of the three-dimensional printer and exposing the photocuring material to a light source of the three-dimensional printer.

In at least one embodiment, the touch electrode layer is formed by jetting a conductive material on the base layer by a second nozzle of the three-dimensional printer and exposing the conductive material to a light source of the three-dimensional printer.

In at least one embodiment, the protective layer is formed by jetting a photocuring material on the base layer and the touch electrode layer by a first nozzle of the three-dimensional printer and exposing the photocuring material to a light source of the three-dimensional printer.

In at least one embodiment, the touch electrode layer includes a plurality of touch electrodes, and the touch electrodes respectively extend along a first direction and are arranged side by side along a second direction.

In at least one embodiment, the touch substrate further includes a plurality of bonding pads disposed on edges of the touch electrodes. The bonding pads are formed by jetting a conductive material respectively on the edges of the touch electrodes by a second nozzle of the three-dimensional printer and exposing the conductive material to a light source of the three-dimensional printer. Each of the bonding pads extends along a third direction, and the third direction is substantially perpendicular to the first direction and the second direction respectively.

In at least one embodiment, the touch electrode layer includes a plurality of first touch electrodes and a plurality of second touch electrodes, the first touch electrodes respectively extend along a first direction and are arranged side by side along a second direction, and the second touch electrodes respectively extend along the second direction and are arranged side by side along the first direction.

In at least one embodiment, the touch substrate further includes a plurality of first bonding pads and a plurality of second bonding pads. The first bonding pads are respectively disposed on edges of the first touch electrodes. The second bonding pads are respectively disposed on edges of the second touch electrodes. The first bonding pads and the second bonding pads are formed by jetting a conductive material respectively on the edges of the first touch electrodes and the edges of the second touch electrodes by a second nozzle of the three-dimensional printer and exposing the conductive material to a light source of the three-dimensional printer. Each of the first bonding pads and each of the second bonding pads respectively extend along a third direction, and the third direction is substantially perpendicular to the first direction and the second direction respectively.

As mentioned above, as to the touch substrate manufactured by 3D printing and the method for manufacturing the same according to the disclosure, the photocuring material is jetted by the first nozzle and exposed to the light source to form the base layer, the conductive material is jetted on the base layer by the second nozzle and exposed to the light source to form the touch electrode layer, and then the photocuring material is jetted on the base layer and the touch electrode layer by the first nozzle and exposed to the light source to form the protective layer. Moreover, the touch electrode layer is embedded between the base layer and the protective layer. Accordingly, compared with the conventional technology which manufactures the touch substrate by the semiconductor manufacturing process, the touch substrate and the method for manufacturing the same according to the disclosure have the advantages of simple manufacturing process, higher precision, and relatively simple preparation of material.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The embodiments will be apparent from the following detailed description, which proceeds with reference to the accompanying drawings, wherein the same references relate to the same elements. Moreover, the drawings of all implementation are schematic, and they do not mean the actual size and proportion.

Figure 1:
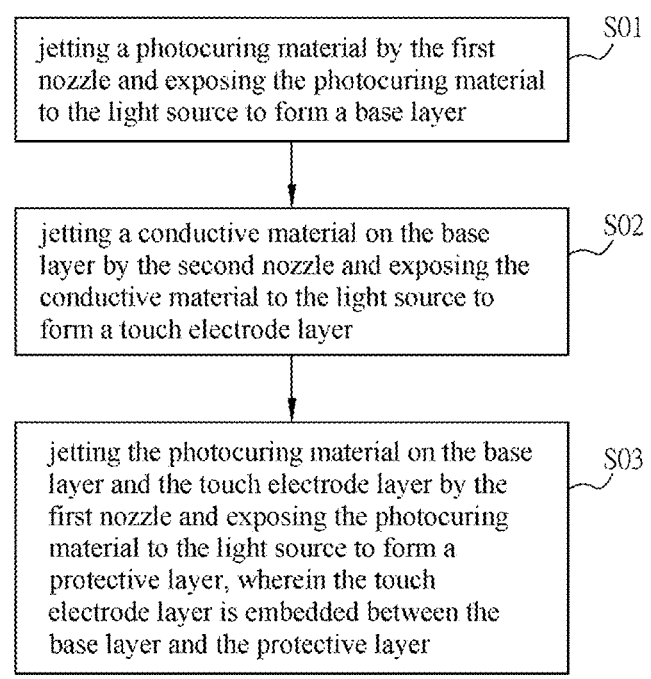
FIG. 1 is a flow chart showing the steps of manufacturing a touch substrate by 3D printing according to at least one embodiment of the disclosure.

Referring to FIG. 1 and FIG. 2A to FIG. 2F, FIG. 1 is a flow chart showing the steps of manufacturing a touch substrate by 3D printing according to at least one embodiment of the disclosure, and FIG. 2A to FIG. 2F are schematic diagrams respectively showing the process of manufacturing the touch substrate 1 according to the steps shown in FIG. 1.

The method for manufacturing the touch substrate 1 according to the disclosure works together with a three-dimensional (3D) printer 2. The 3D printer 2 employs bondable material such as powdered metal, plastic or the like to construct an article by stacking and accumulating layer by layer, namely layered manufacturing. The 3D appearance of an article which is going to be printed is drawn on the computer, and then a G-code (G-code is a programming language for manufacturing 3D articles, and G-code includes parameters or related instructions for controlling the movement of the 3D printer 2) file is produced by a slicer software. The G-code file is capable of controlling the 3D printer 2 to print out the drawn article. In at least this embodiment, the 3D printer 2 constructs the article by using material jetting technology, which is a technology utilizing nozzle jetting and stereolithography.

As shown in FIG. 1, the method for manufacturing the touch substrate 1 at least includes the following steps of: jetting a photocuring material by the first nozzle and exposing the photocuring material to a light source to form a base layer (step S01); jetting a conductive material on the base layer by the second nozzle and exposing the conductive material to the light source to form a touch electrode layer (step S02); and jetting the photocuring material on the base layer and the touch electrode layer by the first nozzle and exposing the photocuring material to the light source to form a protective layer, wherein the touch electrode layer is embedded between the base layer and the protective layer (step S03).

Figure 2A:
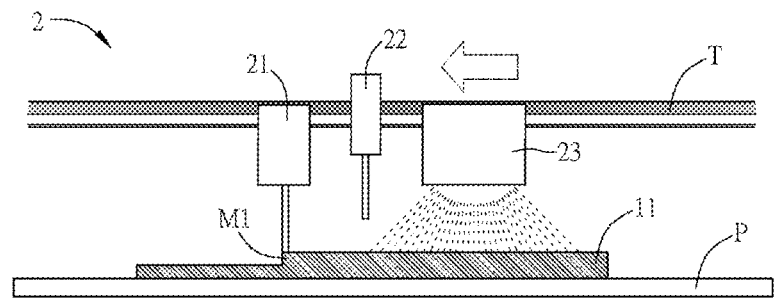
FIG. 2A to FIG. 2F are schematic diagrams respectively showing the process of manufacturing the touch substrate according to the steps shown in FIG. 1.

As shown in FIG. 2A, the 3D printer 2 includes a first nozzle 21, a second nozzle 22, and a light source 23. The first nozzle 21, the second nozzle 22, and the light source 23 are installed on a track T, and they may move on the track T along a direction (FIG. 2 shows they move to the left). However, in addition to moving on the track T along a direction, the first nozzle 21, the second nozzle 22, and the light source 23 may also move along other directions (not shown) by other tracks or mechanisms to accomplish the 3D printing of an article. The first nozzle 21 may jet out the photocuring material (e.g. photopolymerizable resin), and the second nozzle 22 may jet out the conductive material (or extra fine wire). The photocuring material is insulating material (light transmissive or opaque), and the photocuring material is cured and solidified after being exposed to the light emitted from the light source 23. The conductive material (or extra fine wire) also needs to be cured and solidified by being exposed to the light emitted from the light source 23 to form the conductive layer.

In step S01, as shown in FIG. 2A, the first nozzle 21 jets the photocuring material M1 on a platform P, and the photocuring material M1 is exposed to the light source 23 to form a base layer 11. Herein, the first nozzle 21 jets out the photocuring material M1 first, and then the light source 23 emits, for example but not limited to, ultraviolet (UV) light to cure the photocuring material M1 and form the base layer 11. In one embodiment, the thickness of the base layer 11 may be, for example, between 5 μm and 15 μm. Moreover, the photocuring material M1 includes a photoinitiator, an oligomer, a prepolymer, a reactive diluent, and an additive ultraviolet curing material. The ultraviolet curing material may be classified into two categories: free radical type and cation type. The free radical type includes photo-cleavage Type I and Type II. Type I may be, for example, benzoin ether, benzyl ketal, hydroxyalkylphenones, α-amino ketones, acylphosphine oxides, and hydrogen abstraction. Type II may be, for example, benzophenone, xanthones, thioxanthones, aromatic diketones, phenylglyoxalates, camphorquinone, or the like. Moreover, the cation type may mostly be iodonium salts or sulfonium salts, namely conventional acrylic material, epoxy resin, or vinyl ether material.

Figure 2B:
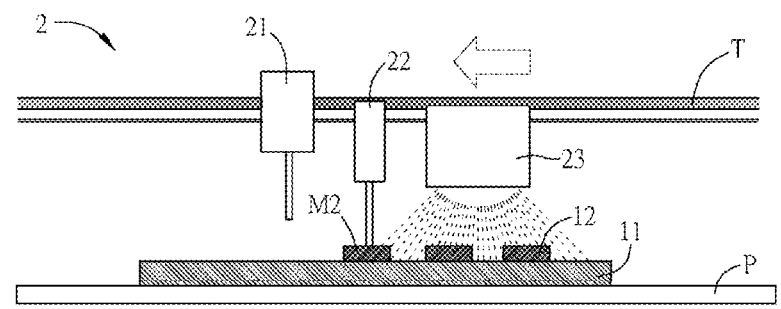

In step S02, as shown in FIG. 2B, the second nozzle 22 jets the conductive material M2 on the base layer 11, and the conductive material M2 is exposed to the light source 23 to form a touch electrode layer 12. Similarly, the second nozzle 22 jets out the conductive material M2 first, and then the light source 23 emits light (UV light) to cure the conductive material M2 and form the touch electrode layer 12. Herein, the conductive material M2 may be light transmissive and patterned. The conductive material M2 may, for example, include the photocuring material M1 and a plurality of conductive particles doped in the photocuring material M1. The conductive particles may be nickel, gold, tin, silver, an alloy thereof, or a combination thereof. Although the photocuring material M1 is non-conductive, the conductive material M2 (the touch electrode layer 12) is a conductor due to the conductive particles. Accordingly, the material of the touch electrode layer 12 is different from the material used for manufacturing a transparent conductive layer by conventional technology (e.g. ITO).

Figure 2C:
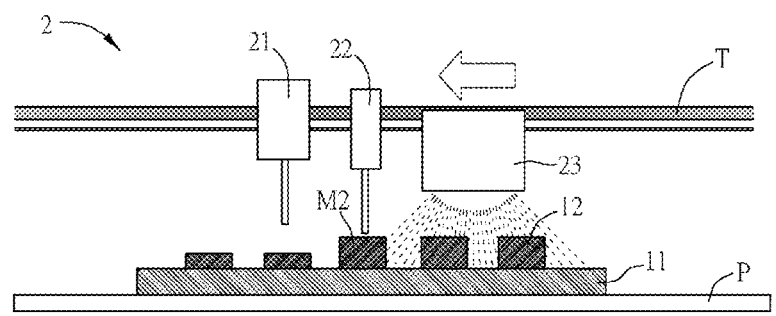

Moreover, in response to the requirements of thickness and shape of the base layer 11, the touch electrode layer 12 or other layers, the first nozzle 21 or the second nozzle 22 cannot just jet once along a direction to form the required thicknesses and shapes of the base layer 11, the touch electrode layer 12, or other layers. However, the required thicknesses and shapes of the base layer 11, the touch electrode layer 12 or other layers are formed by jetting material repeatedly and/or jetting material along multiple directions and on multiple positions according to required thicknesses and shapes of the designed article. In the embodiment, as shown in FIG. 2C, the touch electrode layer 12 obtains the required thickness and shape by repeatedly jetting and being exposed to the light.

In some embodiments, the 3D printer 2 may further include a measurement unit (not shown in the drawings). The measurement unit may be, for example, a photographic lens (camera). The measurement unit may simultaneously monitor the thickness of the photocuring material M1 or the conductive material M2 jetted by the nozzle 21 or 21 for following thickness compensation. As a result, the jetting amount of the material can be precisely controlled to form the required thickness or shape.

Figure 2D:
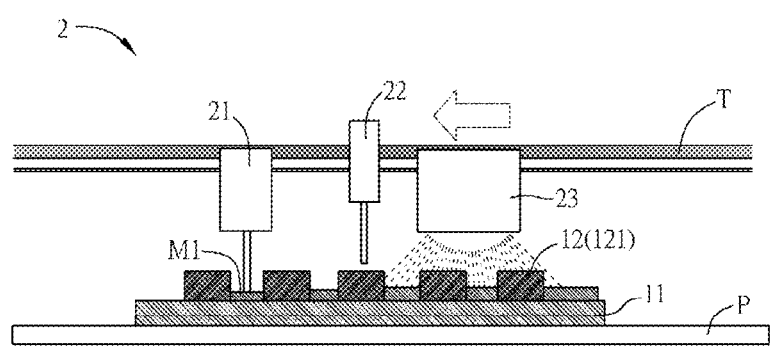
Figure 2E:
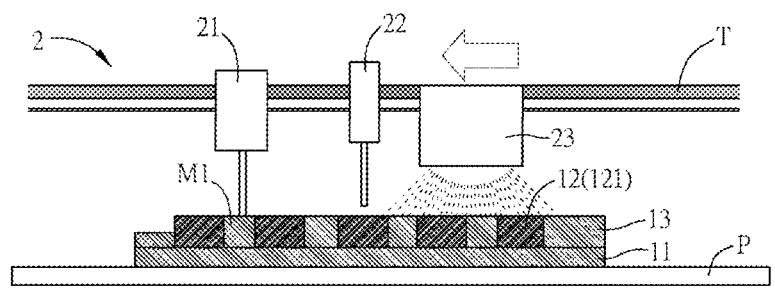
Figure 2F:
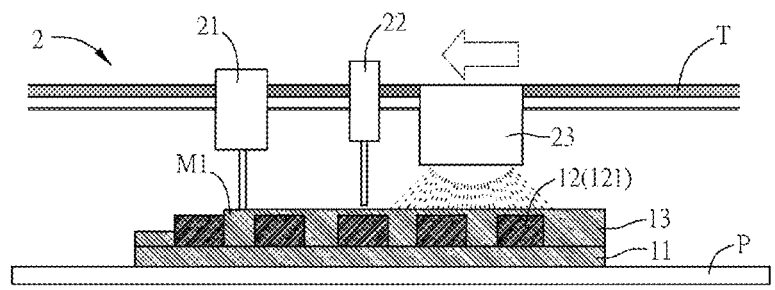

In addition, before step S03, as shown in FIG. 2D and FIG. 2E, the method for manufacturing the touch substrate 1 may further include: jetting the photocuring material M1 between a plurality of touch electrodes 121 on the touch electrode layer 12 by the first nozzle 21 and exposing the photocuring material M1 to the light source 23 so as to fill the space between two adjacent touch electrodes 121 with the photocuring material M1 (insulating material). Then, as shown in FIG. 2F, step S03 is performed to jet the photocuring material M1 on the base layer 11 and the touch electrode layer 12 by the first nozzle 21, and the photocuring material M1 is exposed to the light source 23 to form a protective layer 13, so that the touch electrode layer 12 is embedded between the base layer 11 and the protective layer 13.

It should be noted that the above embodiment of the manufacturing method illustrated by FIG. 2A to FIG. 2F together with FIG. 1 is to manufacture the touch substrate 1 containing a single-layered electrode layer. In practice, the touch substrate containing multilayered electrode layers can be manufactured by repeating step S02 and step S03 of the above mentioned manufacturing method shown in FIG. 1.

Referring to FIG. 3A to FIG. 3D, they are schematic diagrams respectively showing the touch substrates 1a to 1d manufactured by the 3D printer according to different embodiments of the disclosure.

Figure 3A:
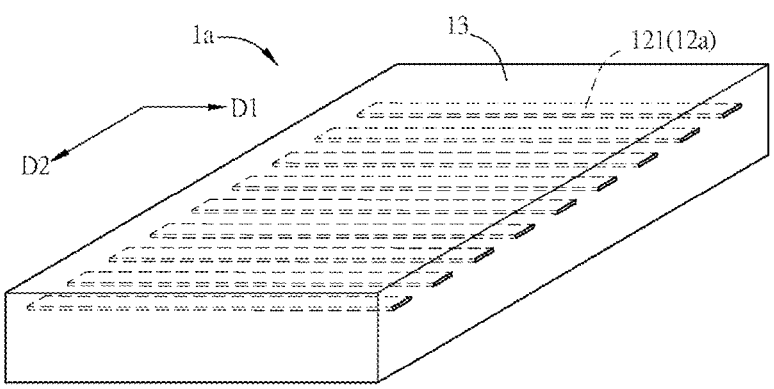
FIG. 3A to FIG. 3D are schematic diagrams respectively showing the touch substrates according to different embodiments of the disclosure.

As shown in FIG. 3A, the touch substrate 1a is manufactured according to the above mentioned steps, and the touch substrate 1a includes a base layer 11, a touch electrode layer 12a, and a protective layer 13. The touch electrode layer 12a is disposed on the base layer 11, and the protective layer 13 is disposed on the base layer 11 and the touch electrode layer 12a. The material of the protective layer 13 is identical to that of the base layer 11, they are the same photocuring material (only 13 is indicated because they are the same material), and the touch electrode layer 12a is embedded between the base layer 11 and the protective layer 13. The base layer 11 is formed by jetting the photocuring material M1 by the first nozzle 21 and exposing the photocuring material M1 to the light source 23. The touch electrode layer 12a is formed by jetting the conductive material M2 on the base layer 11 by the second nozzle 22 and exposing the conductive material M2 to the light source 23. The protective layer 13 is formed by jetting the photocuring material M1 on the base layer 11 and the touch electrode layer 12a by the first nozzle 21 and exposing the photocuring material M1 to the light source 23. Moreover, in above mentioned step S02 of jetting the conductive material M2, the formed touch electrode layer 12a includes a plurality of first touch electrodes 121, and the touch electrodes 121 respectively extend along a first direction D1 and are arranged side by side along a second direction. In the embodiment, the second direction D2 is substantially perpendicular to the first direction D1 but not limited thereto.

Figure 3B:
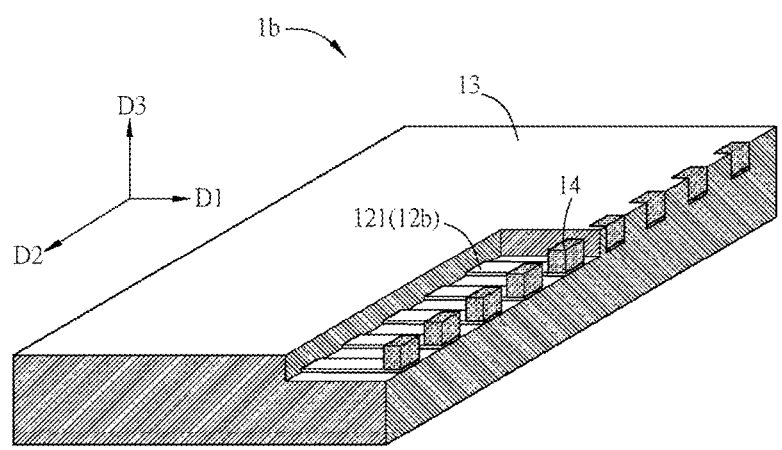

In addition to the above mentioned method for manufacturing the touch substrates 1 and 1a, as shown in FIG. 3B, prior to forming the protective layer 13, the method for manufacturing the touch substrate 1b according to the embodiment may further include the following step of: jetting the conductive material M2 respectively on the edges of the touch electrodes 121 on the touch electrode layer 12b by the second nozzle 22 and exposing the conductive material M2 to the light source 23 to form a plurality of bonding pads 14. Each of the bonding pads 14 extends along a third direction D3, and the third direction D3 is substantially perpendicular to the first direction D1 and the second direction D2 respectively. The material of the bonding pads 14 is identical to that of the touch electrodes 121. That is, the bonding pads 14 and the touch electrodes 121 are both formed by curing the conductive material M2. The surfaces of the bonding pads 14 are exposed from the protective layer 13 to form the touch substrate 1b containing a single-layered electrode layer. Moreover, each of the touch electrodes 121 may respectively extend to the lateral side of the protective layer 13 and may be connected (electrically connected) to each of the bonding pads 14 which extends along the third direction. In the embodiment, the touch electrodes 121 may include a plurality of drive electrodes (Tx) and a plurality of sensing electrodes (Rx). When a user touches the touch electrodes 121, the electrical signals generated by touching are transmitted from the touch electrodes 121 to the corresponding bonding pads 14 and then transmitted to a touch control circuit board (not shown in the drawings) thereby to generate a corresponding control action.

Figure 3C:
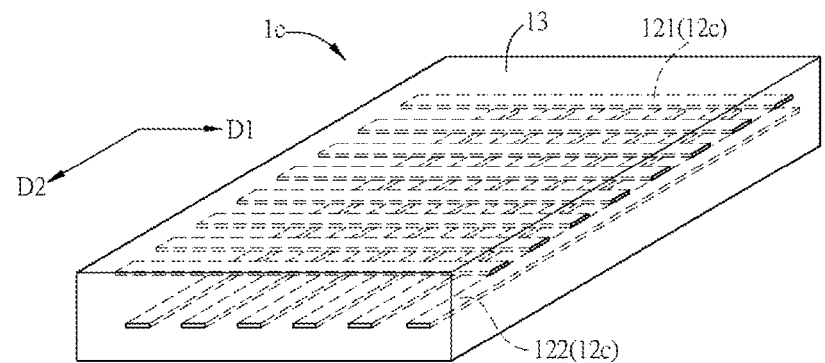

As shown in FIG. 3C, in the manufacturing process of the touch substrate 1c according to this embodiment, the touch electrode layer 12c includes a plurality of first touch electrodes 121 and a plurality of second touch electrodes 122. The first touch electrodes 121 respectively extend along the first direction D1 and are arranged side by side along the second direction D2. The second touch electrodes 122 respectively extend along the second direction D2 and are arranged side by side along the first direction D1. In the embodiment, the first touch electrodes 121 and the second touch electrodes 122 are located in different planes and are interlaced, and the interlaced portions are spaced by the protective layer 13 so as to avoid that the first touch electrodes 121 and the second touch electrode 122 are shorted. In the embodiment, the first touch electrodes 121 may, for example, be drive electrodes (Tx), and the second touch electrodes 122 may, for example, be sensing electrodes (Rx).

Figure 3D:
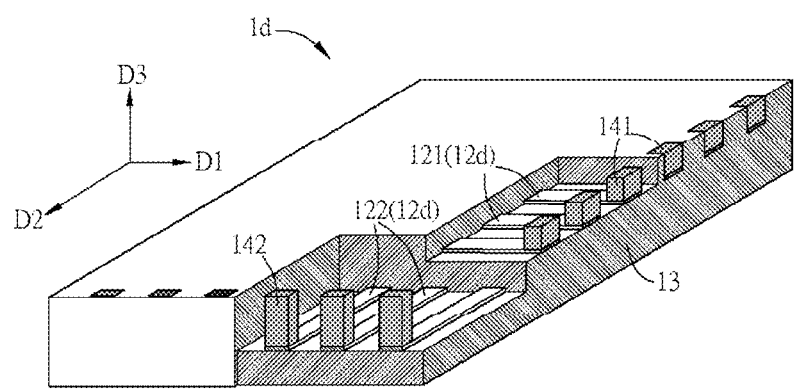

In addition to the above mentioned method for manufacturing the touch substrates 1 and 1c, as shown in FIG. 3D, the method for manufacturing the touch substrate 1d according to this embodiment may further include the following step of: jetting the conductive material M2 respectively on edges of the first touch electrodes 121 and edges of the second touch electrodes 122 on the touch electrode layer 12d by the second nozzle 22 and exposing the conductive material M2 to the light source 23 to form a plurality of first bonding pads 141 and a plurality of second bonding pads 142. Herein, each of the first bonding pads 141 and each of the second bonding pads 142 respectively extend along the third direction D3, and the third direction D3 is substantially perpendicular to the first direction D1 and the second direction D2 respectively. In the embodiment, the materials of the first bonding pads 141 and the second bonding pads 142 are identical to those of the first touch electrodes 121 and the second touch electrodes 122 on the touch electrode layer 12d, and the first bonding pads 141, the second bonding pads 142, the first touch electrodes 121 and the second touch electrodes 122 are all formed by curing the conductive material M2. The surfaces of the first bonding pads 141 and the second bonding pads 142 are respectively exposed from the protective layer 13 to form the touch substrate 1d containing a double-layered electrode layer. Moreover, each of the first touch electrodes 121 and each of the second touch electrodes 122 may respectively extend to the lateral sides of the protective layer 13 and are connected (electrically connected) to each of the corresponding first bonding pads 141 and each of the corresponding second bonding pads 142 which extend along the third direction D3. When a user touches the first touch electrodes 121 and the second touch electrodes 122, the electrical signals generated by touching are transmitted from the first touch electrodes 121 and the second touch electrodes 122 to the corresponding first bonding pads 141 and the corresponding second bonding pads 142 and then transmitted to a touch control circuit board (not shown in the drawings) thereby to generate a corresponding control action.

Moreover, other technical features of the touch substrates 1a, 1b, 1c and 1d and the manufacturing methods thereof may refer to the above mentioned touch substrate 1 so they are not repeated here.

As mentioned above, the disclosure is to manufacture the touch substrate by using 3D printing technology, and the technical features are as follows. (1) The touch electrode layer and the bonding pads are all embedded in the base layer and the protective layer, and only the surfaces of the bonding pads are exposed. (2) The materials of the base layer, the protective layer and the insulating layer (i.e. the protective layer (bridges) between the interlaced portions of the first touch electrodes and the second touch electrodes) are the same, and all of them are photocuring material. (3) The materials of the touch electrodes, traces and the bonding pads are the same, and all of them are conductive material. Therefore, the preparation of material is relatively simple. (4) The touch substrate may have a structure of single-layered electrode layer or a structure of double-layered electrode layer. The structure of the single-layered electrode layer may include the electrodes in the same direction or the interlaced electrodes in two directions. As to the single-layered interlaced electrodes, the bridge material between the interlaced electrodes may be identical to the (dielectric) materials of the base layer and the protective layer. The insulating layer (bridges) may also be formed of different dielectric material (however, an additional third nozzle is needed and the precision will be higher). The manufacturing process of the touch substrate according to the disclosure is simple and highly precise. (5) Compared with the overcoat (OC) on the touch electrode manufactured by conventional technology, the protective layer on the touch electrode layer can be very thin and flat in the disclosure. (6) The measurement unit (e.g. photographic lens) may be added to the 3D printing process equipment so as to simultaneously monitor the thickness during printing for following compensation. As a result, the jetting amount of the material can be precisely controlled. (7) The photocuring material may be transparent material so a display image can be seen if the touch substrate is combined with a display panel. Alternatively, if the touch substrate is not combined with a display panel, for example, the touch substrate serves as a touch pad of a laptop, the photocuring material may be opaque material. (8) 3D printing manufacturing process can avoid the conventional circumstance that the turning points are easily broken when the touch electrodes and traces are not manufactured in the same plane. (9) For the touch substrate according to the disclosure, there is no need to use, for example, optical clear adhesive (OCA) for bonding. Therefore, there is no problem of bubbles generated during bonding, and there is no need to manufacture a "planarization layer" particularly so the steps of the manufacturing process can be reduced. (10) The disclosure is adapted to curved surface displays or 3D displays, and it can improve the precision of the manufacturing process and reduce the difficulty of the manufacturing process in comparison to conventional technology.

In summary, as to the touch substrate manufactured by 3D printing and the method for manufacturing the same according to the disclosure, the photocuring material is jetted by the first nozzle and exposed to the light source to form the base layer, the conductive material is jetted on the base layer by the second nozzle and exposed to the light source to form the touch electrode layer, and then the photocuring material is jetted on the base layer and the touch electrode layer by the first nozzle and exposed to the light source to form the protective layer. Moreover, the touch electrode layer is embedded between the base layer and the protective layer. Accordingly, compared with the conventional technology which manufactures the touch substrate by the semiconductor manufacturing process, the touch substrate and the method for manufacturing the same according to the disclosure have the advantages of simple manufacturing process, higher precision, and relatively simple preparation of material.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method for manufacturing a touch substrate by working together with a three-dimensional printer including a first nozzle, a second nozzle, and a light source, the method comprising:
   jetting a photocuring material by the first nozzle and exposing the photocuring material to the light source to form a base layer;
   jetting a conductive material on the base layer by the second nozzle and exposing the conductive material to the light source to form a touch electrode layer; and
   jetting the photocuring material on the base layer and the touch electrode layer by the first nozzle and exposing the photocuring material to the light source to form a protective layer, wherein the touch electrode layer is embedded between the base layer and the protective layer.

2. The method of claim 1, further comprising:
   jetting the photocuring material between a plurality of touch electrodes on the touch electrode layer by the first nozzle and exposing the photocuring material to the light source.

3. The method of claim 1, wherein in the step of jetting the conductive material, the touch electrode layer includes a plurality of touch electrodes, and the touch electrodes respectively extend along a first direction and are arranged side by side along a second direction.

4. The method of claim 3, further comprising:
   jetting the conductive material respectively on edges of the touch electrodes by the second nozzle and exposing the conductive material to the light source to form a plurality of bonding pads, wherein each of the bonding pads extends along a third direction, and the third direction is substantially perpendicular to the first direction and the second direction respectively.

5. The method of claim 1, wherein in the step of jetting the conductive material, the touch electrode layer comprises a plurality of first touch electrodes and a plurality of second touch electrodes, the first touch electrodes respectively extend along a first direction and are arranged side by side along a second direction, and the second touch electrodes respectively extend along the second direction and are arranged side by side along the first direction.

6. The method of claim 5, further comprising:
   jetting the conductive material respectively on edges of the first touch electrodes and edges of the second touch electrodes by the second nozzle and exposing the conductive material to the light source to form a plurality of first bonding pads and a plurality of second bonding pads, wherein each of the first bonding pads and each of the second bonding pads respectively extend along a third direction, and the third direction is substantially perpendicular to the first direction and the second direction respectively.

7. The method of claim 1, wherein the photocuring material comprises a photoinitiator, an oligomer, a prepolymer, a reactive diluent, and an additive ultraviolet curing material.

8. The method of claim 1, wherein the conductive material comprises the photocuring material and a plurality of conductive particles, and the conductive particles are nickel, gold, tin, silver, an alloy thereof, or a combination thereof.

* * * * *